United States Patent [19]
Pierrat

[11] Patent Number: 5,935,740
[45] Date of Patent: Aug. 10, 1999

[54] METHOD AND APPARATUS FOR THE FABRICATION OF SEMICONDUCTOR PHOTOMASK

[75] Inventor: Christophe Pierrat, Boise, Id.

[73] Assignee: Micron Technology, Inc., Boise, Id.

[21] Appl. No.: 09/177,691

[22] Filed: Oct. 22, 1998

Related U.S. Application Data

[62] Division of application No. 08/762,540, Dec. 9, 1996, Pat. No. 5,851,704.

[51] Int. Cl.⁶ .................................................. G03F 9/00
[52] U.S. Cl. .................................................. 430/5
[58] Field of Search .............................. 430/5, 322, 323

[56] References Cited

U.S. PATENT DOCUMENTS

| | | | |
|---|---|---|---|
| 5,229,255 | 7/1993 | White | 430/311 |
| 5,308,721 | 5/1994 | Garofalo et al. | 430/5 |
| 5,308,722 | 5/1994 | Nistler | 430/5 |
| 5,405,721 | 4/1995 | Pierat | 430/5 |

*Primary Examiner*—S. Rosasco
*Attorney, Agent, or Firm*—Fletcher, Yoder & Van Someren

[57] ABSTRACT

The present invention provides a method and apparatus of fabricating photomasks. The photomasks may be fabricated from a photomask blank structure having multiple layers. Upon patterning of these multiple layers by standard photolithographic processes, a photomask is created which is capable of phase-shifting incident light by various degrees, which may be 0°, 60°, 120°, and 180°.

45 Claims, 2 Drawing Sheets

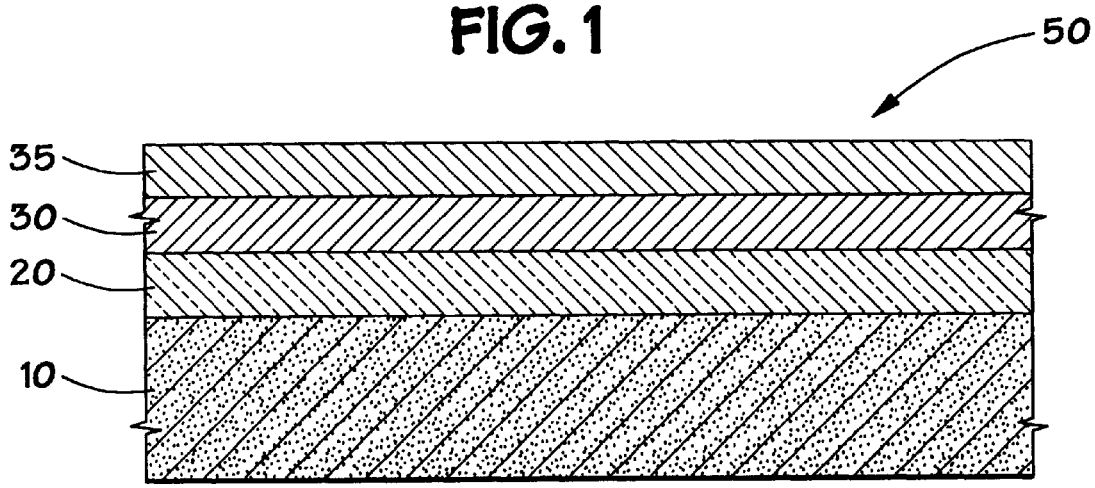
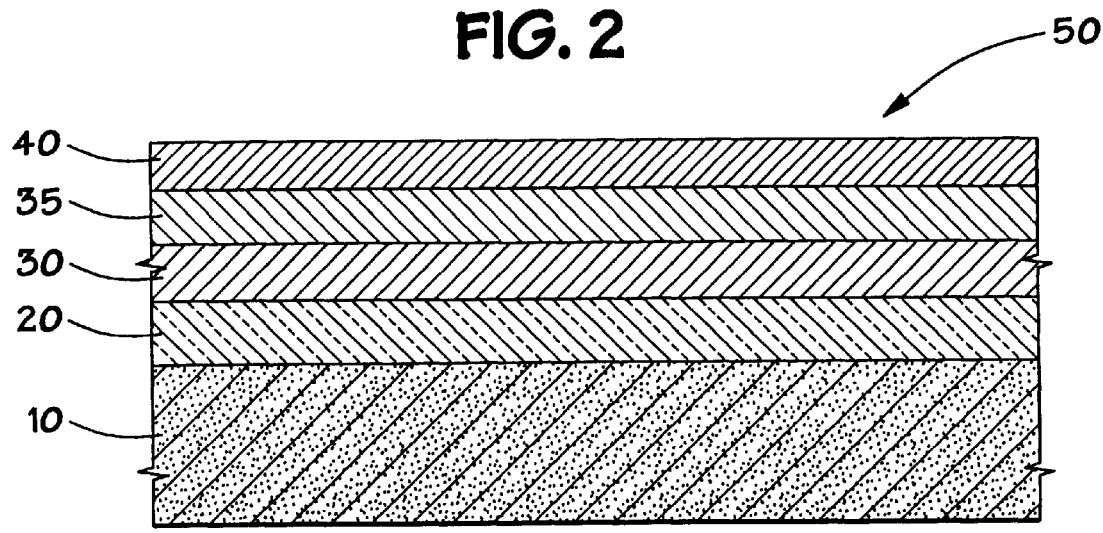

METHOD AND APPARATUS FOR THE
FABRICATION OF SEMICONDUCTOR
PHOTOMASK

This application is a Divisional of application Ser. No. 08/762,540 filed Dec. 9 1996. Now U.S. Pat. No. 5,851,704

This invention was made with government support under contract no. MDA 972-92-C-0054 awarded by Advanced Research Projects Agency (ARPA). The government has certain rights in this invention

FIELD OF THE INVENTION

The present invention relates to a photomask used in a photolithography process and, more specifically, to an apparatus and method for fabricating a photomask.

BACKGROUND OF THE INVENTION

A photomask may be used to transfer a pattern to a semiconductor wafer. The pattern which is to be transferred onto the wafer may be formed on a photomask substrate which is substantially transparent. The pattern may be formed on a photomask blank structure by standard photolithography processes. Typically, the blank structure is a substrate that is transparent, such as quartz. The substrate may also include thin films of metal or other nontransparent material, which act to block light passing through the substrate. In this way, a pattern is transferred onto the semiconductor wafer. In particular photomasks, the non-transparent material may be a chrome material, such as opaque chrome.

Due to limitations imposed by the wavelength of light used to transfer the pattern, resolution at the edges of the patterns of the photomask degrades. Use of phase-shifting photomasks is one method of increasing the resolution of patterns by creating phase-shifting regions in the transparent areas of a photomask. Standard phase-shift masks generally are formed either by depositing transparent films of appropriate thickness and patterning them over the desired transparent areas using a second level lithography and etch technique, or by etching vertical trenches in the substrate. In both of these instances, the "edges" or "walls" between the phase-shifted and unshifted regions generally result in a transition between high and low refractive index regions.

The characteristics of the phase-shifting photomask described above generally relate to a hard or strong phase-shifter type. This type of photomask is known as an "alternating aperture" or "Levenson-type" phase-shift mask. These types of masks include transmission regions (light transmitted through the substantially transparent regions) on either side of a patterned opaque feature. One of these transmission regions is phase-shifted from the other, and both sides transmit approximately 100% of the incident radiation. These phase-shift regions may be any desired degree, such as 0°, 60°, 120°, or 180°, for example. Light diffracted underneath the opaque regions from these phase-shifted regions thus cancels each other, thereby creating a more intense null, or "dark area."

Fabrication of alternating aperture masks is somewhat difficult because the phase-shift layer is defined either by etching the quartz substrate or by depositing a silicon dioxide layer and patterning it. The main limitation of these two techniques is the absence of etch stop or end point during the manufacturing of the phase-shift pattern or during the repair of the phase-shift pattern.

In one prior art method of fabricating a phase-shifting photomask, two transparent layers are deposited above a transparent substrate. These transparent layers are then patterned to create a photomask that has a phase shift of 180° or π radians. It is to be noted that a phase shift of π radians is equivalent to 180°, and that degrees and radians may be used interchangeably. The purpose of having two transparent layers over the substrate is to aid in the repair of the photomask. By use of the transparent layers, defects on the surface of the patterns may be minimized.

Other methods of fabricating phase-shifting photomasks are known in the art. For example, a transparent substrate having a metal layer patterned above it may be partially etched multiple times to create a phase-shifting photomask. The purpose of the partial etch steps is to ensure that a defect on the partially etched phase-shifting layer is not transferred to a semiconductor wafer to be exposed by the photomask.

SUMMARY OF THE INVENTION

In accordance with one aspect of the present invention, there is provided an apparatus for the fabrication of a semiconductor photomask which may include a substrate, at least three layers located above the substrate, at least two of the layers having chemical compositions different than the substrate, a top layer above the third layer, and openings within the top layer and at least two of the three layers such that light incident upon the photomask exits the photomask with at least three phase angles.

BRIEF DESCRIPTION OF THE DRAWINGS

A better appreciation of the present invention may be gained from a study of the specific disclosed embodiments, and of the drawings in which:

FIG. 1 is a cross-sectional diagram showing a substrate over which is deposited multiple layers according to the present invention.

FIG. 2 is a cross-sectional diagram showing a substrate having multiple layers according to the present invention.

Figure 3:
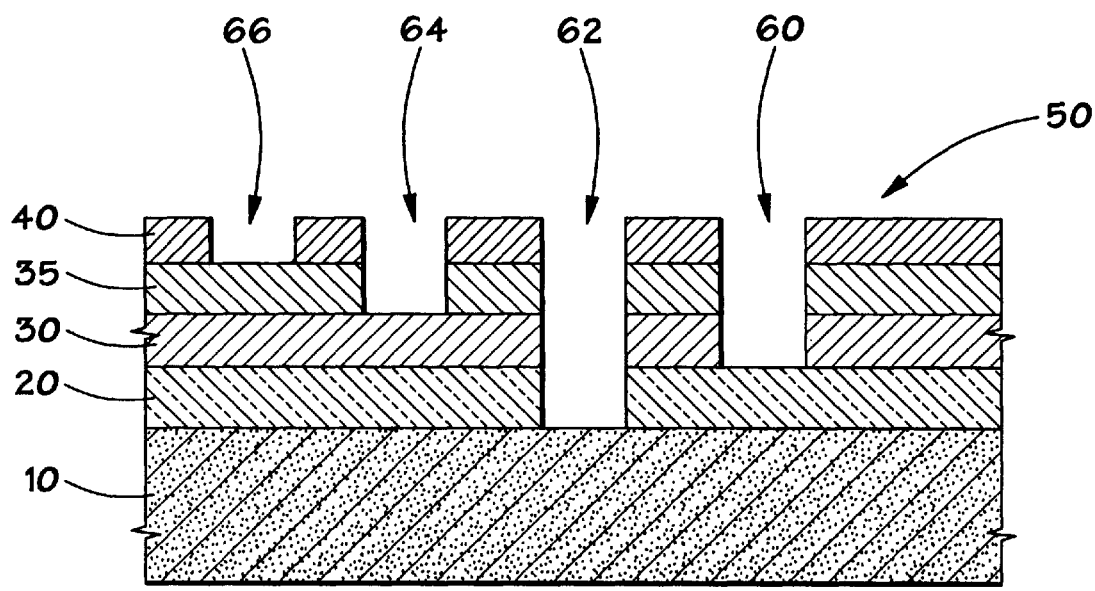
FIG. 3 is a cross sectional diagram showing a formation of a patterned substrate according to the present invention.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

A multiple layer blank structure is utilized to create a photomask. There are several reasons why it is desirable to utilize a multiple layer blank structure. First, each layer may precisely define a certain phase-shift, given that the layer may be created with accurate thickness. Second, while patterning a given layer, the underlying layer may be used as an end point or etch stop. Further, for the repair of a given layer, the underlying layer may be used as an end point or etch stop. The mask created by this process may be a Levenson-type or alternating aperture phase-shift mask. Alternately, the methods described herein also may be utilized for creating non-phase-shifting photomasks.

FIGS. 1–3 show a cross-sectional representation of a multiple layer photomask blank. FIG. 1 shows a mask blank structure 50, which may include a substrate 10, over which are located multiple layers. In various embodiments, there may be from 3 to 6 layers located over the substrate 10, and more advantageously 4 layers. In the exemplary embodiment shown in FIG. 1, there are 3 layers located over substrate 10.

Substrate 10, which may be quartz, glass, or any other substantially transparent material, is used as the base of mask blank 50. A first layer 20, which may be a phase-shifting layer is placed over the substrate, as shown in FIG. 1. However, it will be recognized that there may be various intermediate process layers between the substrate 10 and first layer 20 or between other layers disclosed herein. Thus, as used herein one layer may be "on" another layer even if intermediate layers are formed between the two layers.

This phase-shifting layer may be comprised of a light-transmitting material that is substantially transparent. Substantially transparent generally means that the layer may allow greater than approximately 90% of incident light (as compared to air), and more advantageously as close as possible to 100% of light to pass through. It is to be noted that the designation "substantially transparent" refers to the transparency at the exposure wavelength of the light energy used in fabrication. However, it is to be understood that the layers may be more or less transparent at other wavelengths.

In an exemplary embodiment, it may be desired to fabricate the photomask blank structure such that first layer 20 may have a phase-shift of approximately 60 degrees. In an exemplary embodiment, it may be desired that each of three layers have a phase-shift of approximately 60°. The first layer 20 may be made of $LaF_3$ (lanthanum fluoride), $YF_3$ (yttrium fluoride) or any other material capable of acting as an etch stop layer for the layer above it, and matching the refractive index of quartz. The first layer 20 may have a thickness of approximately 128 nm to create a 60° phase-shift at a 365 nm wavelength. It is to be noted that the phase-shift of a layer is dependent upon its thickness in relation to the wavelength of the incident light, and the refractive index of the composition of the layer. Further, a thickness of $\lambda/2(n-1)$ corresponds to a phase-shift of 180°, where $\lambda$ equals the wavelength of incident light, and n equals the refractive index of the composition of the layer. Thus, other materials may be used to form layer 20 by selecting a combination of material and thickness that achieves the desired phase-shift. The first layer 20 may be deposited by known techniques, such as CVD, RF sputtering, or the like.

Over the first layer 20, additional layers may be deposited. For example, as shown in FIG. 1, layers 30 and 35 may be deposited. These layers may be approximately 128 nm each to comprise a 60° phase-shift for each layer at an incident light wavelength of 365 nm. Materials utilized for layers 30 and 35 may include $LaF_3$, $YF_3$, $SiO_2$ (silicon dioxide), or other materials. It is to be understood that each layer may be deposited so that it is of a substantially uniform thickness prior to patterning. It is to be noted, however, that all layers need not be comprised of the same material or thickness, and different layers may have different thicknesses to create phase-shifting layers of varying degrees. As discussed above, these layers may be deposited by known techniques, such as CVD, RF sputtering, or the like.

The composition selection of layers 20, 30, and 35 may be determined based on desired properties of the photomask to be fabricated. For example, in an alternating aperture mask, it may be desired that each layer be substantially transparent. Further, it may be desired that each layer act as an etch stop layer for the layer or layers above it. In an exemplary embodiment, the substrate 10 may be quartz, the first layer 20 may be $LaF_3$ or $YF_3$, and the second layer 30 may be $SiO_2$, or any other material that is capable of being an etch stop layer for the layer above it and matching the refractive index of quartz. The third layer 35 may be comprised of the same composition as the first layer 20. Alternately, it may be comprised of a different composition that meets the above criteria.

Over this third layer 35, a fourth layer 40, which may be made of metal such as chrome, a combination of chrome, oxygen and nitrogen, or other opaque material, such as a combination of molybdenum, silicon, and oxygen, may be deposited, as shown in FIG. 2. In the exemplary embodiment shown in FIG. 2, the fourth layer 40 may be comprised of opaque chrome, which is nontransparent at the exposure wavelength. Upon patterning openings into the fourth layer 40, this embodiment may provide alternating regions that permit incident light to pass through, thereby transferring a pattern onto a semiconductor wafer.

In the exemplary embodiment discussed above, the first, second and third layers 20, 30 and 35 may be between approximately 126 and 130 nm thick, and more advantageously between approximately 127 and 129 nm thick. In an exemplary embodiment, the first, second and third layers 20, 30 and 35 may be approximately 128 nm thick. It is to be noted that these values are appropriate for phase-shift layers of approximately 60° at an incident wavelength of 365 nm. It is to be further noted that the first, second and third layers 20, 30 and 35 need not be of the same thickness. Finally, the fourth layer 40 may be between approximately 90 and 120 nm thick, and more advantageously between approximately 100 and 110 nm thick.

In an exemplary embodiment, the blank structure may be patterned such that regions of the photomask may shift incident light by 0°, 60°, 120°, and 180°. However, any amount of phase between 0° and 180° may be created by fabrication of a multiple layer blank structure. As discussed above, the degree of phase is dependent upon selection of the thickness of the layer and its refractive index, and the wavelength of the incident light. For example, to create a 180° phase-shifting layer for a photomask used with an incident wavelength of 365 nm, a layer or layers may be selected having a thickness of approximately 384 nm.

As shown in FIG. 3, blank structure 50 may be patterned so that openings are created in the multiple layers of the present invention. For example, opening 60 exposes first layer 20, thereby providing a phase-shift of 120°. Opening 62 exposes the substrate 10, thereby providing a phase-shift of 180°. Opening 64 exposes second layer 30, thereby providing a phase-shift of 60°. Finally, opening 66 exposes the third layer 35, thereby providing a phase-shift of 0°. It is to be understood that the above openings are exemplary only, and more or less openings of varying thicknesses and widths may be provided in an exemplary embodiment. Further, although shown penetrating through the entire thickness of the layers, the openings need not be etched to that extent, and the openings may be etched only partially through the thickness of a particular layer.

When fabricating the multilayer photomask blank 50 of the present invention, typical fabrication steps may be utilized to form a patterned photomask with phase-shifting regions having various degrees of shift. For example, a layer of photoresist (not shown) may be placed over the fourth layer 40. The photoresist layer may be comprised of any commercially available photoresist, such as OCG895i, commercially available from OCG. Alternately, the resist layer may be an electron beam-sensitive resist, such as a PBS (polybutene sulfone), commercially available from Mead Chemicals. The photoresist layer may be patterned using standard lithography techniques to form openings in the photoresist layer. Then an etch step, which may be a wet or dry etch, may be performed to create openings within the fourth layer 40. This etch process may use, for example, Cyantek CR-7S or any other etchant to etch openings in the fourth layer 40. Other etching processes, such as a dry plasma etch, which may use a chlorine- or fluorine-based etchant, may be used to etch these openings. It is to be noted that the composition of third layer 35 may be selected such that it acts as an etch stop layer for the fourth layer 40.

These same steps of applying a layer of photoresist, patterning the photoresist, and etching openings into a lower layer may be performed as many times as required to provide a series of openings through the various layers. It is to be noted that each successive layer is selected such that it may act as an etch stop layer for an etch process of a higher layer. For example, the composition of the second layer 30 may be chosen so that it acts as an etch stop layer during etching of openings into the third layer 35. FIG. 3 shows a photomask fabricated from the multilayer mask blank structure of the present invention. It will be recognized that the patterns etched into each layer as shown in FIG. 3 are illustrative and other patterns may be used.

It is to be noted that etchants may be chosen for each layer based on the chemical compositions of the layer to be etched and the layer below it. Specifically, the etchant should be selected such that the layer to be etched is removed by the etchant, but the layer below it is unaffected by the etchant. Thus, the lower layer acts as an etch stop layer. Therefore, a layer may be reetched multiple times to remove any defects present within the layer. The etch rate of the lower layer may be sufficiently low so that it is unaffected by the etch process. For example, if the third layer 35 is $LaF_3$ or $YF_3$, and the second layer 30 is $SiO_2$, $LaF_3$ or $YF_3$ may be chosen as an etchant for the third layer 35. This etchant may be applied several times to adequately etch the third layer 35, but not affect the second layer 30. Likewise, if the first layer 20 is $LaF_3$ or $YF_3$, a $SiO_2$ second layer 30 may be etched with, for example, a dry etch, such as chlorine or fluorine-based plasma. Finally, the first layer 20 of $LaF_3$ or $YF_3$ may be etched with, for example, a wet etch using basic aqueous solutions.

Fabricating a photomask from the photomask blank structure of the present invention thereby creates a photomask having phase-shift regions of different phase angles based on the thickness of the layers, and the depth of the openings etched into the layers. Additionally, the mask blank of the present invention reduces defects within a photomask, as each of the multiple layers acts as an etch stop layer for the layer located above it, therefore permitting that layer to be reetched to remove any defects present.

In an exemplary embodiment, the substrate may have a plurality of interior layers over it that may be substantially transparent, over which may be an exterior layer that may be a nontransparent layer. For example, the substrate may be made of quartz and the interior layers of $YF_3$, $SiO_2$, $LaF_3$, or a composition of chrome, oxygen and nitrogen, or a composition of molybdenum, silicon, oxygen, or other such compositions, and the exterior layer may be made of chrome. The composition of the interior layers may be adjusted to obtain the desired phase and transmission. The photomask may then be utilized in the photolithography steps of a semiconductor fabrication process to form a semiconductor device such as a logic device, microprocessor, DRAM, SRAM, etc.

What is claimed is:

1. A method of fabricating a semiconductor photomask comprising the acts of:

providing a substrate;

forming three substantially transparent layers located above the substrate, at least two of the substantially transparent layers having different chemical compositions; and patterning at least two of the three substantially transparent layers to provide regions having at least three different phase angles.

2. The method as claimed in claim 1, wherein the act of patterning comprises the acts of:

patterning a photoresist layer above one of the three substantially transparent layers; and etching openings within the exposed portions of the one of the three substantially transparent layers.

3. The method as claimed in claim 1, wherein the openings have a thickness corresponding to a preselected phase angle.

4. A method of fabricating a semiconductor photomask used in the fabrication of a semiconductor wafer, comprising the acts of:

providing a transparent substrate;

forming at least three substantially transparent interior layers above the transparent substrate, at least two of the at least three interior layers having different chemical compositions;

forming an opaque exterior layer above the at least three interior layers; and forming openings within at least two of the three interior layers to cause light incident upon the photomask to exit the photomask with at least three different phase angles to create phase-shifting patterns on the semiconductor wafer.

5. A method of fabricating a photomask blank comprising the acts of:

providing a substantially transparent substrate;

disposing a first phase-shifting layer over the substrate, the first phase-shifting layer having a first thickness;

disposing a second phase-shifting layer over the first phase-shifting layer, the second phase-shifting layer having a second thickness;

disposing a third phase-shifting layer over the second phase-shifting layer, the third phase-shifting layer having a third thickness, wherein a sum of the first, second, and third thicknesses substantially corresponds to a phase shift of about 180°, and wherein at least two of the phase-shifting layers have chemical compositions different than the substrate; and disposing an opaque layer over the third phase-shifting layer.

6. The method, as set forth in claim 5, wherein each of the first, second, and third thicknesses corresponds to a phase shift of less than 180°.

7. The method, as set forth in claim 5, wherein each of the first, second, and third thicknesses corresponds to a phase shift of about 60°.

8. The method, as set forth in claim 5, wherein the first phase-shifting layer comprises $YF_3$ or $LaF_3$.

9. The method, as set forth in claim 5, wherein the second phase-shifting layer comprises $SiO_2$.

10. The method, as set forth in claim 5, wherein the first and third phase-shifting layers comprise the same chemical composition.

11. The method, as set forth in claim 5, wherein the first phase-shifting layer acts as an etch stop layer.

12. A method of fabricating a photomask comprising the acts of:
   providing a substantially transparent substrate;
   disposing a first phase-shifting layer over the substrate, the first phase-shifting layer having a first thickness;
   disposing a second phase-shifting layer over the first phase-shifting layer, the second phase-shifting layer having a second thickness;
   disposing a third phase-shifting layer over the second phase-shifting layer, the third phase-shifting layer having a third thickness, wherein a sum of the first, second, and third thicknesses substantially corresponds to a phase shift of about 180°, and wherein at least two of the phase-shifting layers have chemical compositions different than the substrate; and
   disposing an opaque layer over the third phase-shifting layer, the opaque layer having a plurality of openings formed therein, wherein a portion of at least one of the first, second, and third layers does not underly selected ones of the plurality of the openings.

13. The method, as set forth in claim 12, wherein each of the first, second, and third thicknesses corresponds to a phase shift of less than 180°.

14. The method, as set forth in claim 12, wherein each of the first, second, and third thicknesses corresponds to a phase shift of about 60°.

15. The method, as set forth in claim 12, wherein the first phase-shifting layer comprises $YF_3$ or $LaF_3$.

16. The method, as set forth in claim 12, wherein the second phase-shifting layer comprises $SiO_2$.

17. The method, as set forth in claim 12, wherein the first and third phase-shifting layers comprise the same chemical composition.

18. The method, as set forth in claim 12, wherein the first phase-shifting layer acts as an etch stop layer.

19. A method of fabricating a photomask blank comprising the acts of:
   providing a substantially transparent substrate;
   disposing a first phase-shifting layer over the substrate, the first phase-shifting layer having a first thickness;
   disposing a second phase-shifting layer over the first phase-shifting layer, the second phase-shifting layer having a second thickness, the first phase-shifting layer acting as an etch stop for the second phase-shifting layer;
   disposing a third phase-shifting layer over the second phase-shifting layer, the third phase-shifting layer having a third thickness, the second phase-shifting layer acting as an etch stop for the third phase-shifting layer, wherein a sum of the first, second, and third thicknesses substantially corresponds to a phase shift of about 180°; and
   disposing an opaque layer over the third phase-shifting layer.

20. The method, as set forth in claim 19, wherein each of the first, second, and third thicknesses corresponds to a phase shift of less than 180°.

21. The method, as set forth in claim 19, wherein each of the first, second, and third thicknesses corresponds to a phase shift of about 60°.

22. The method, as set forth in claim 19, wherein the first layer comprises $YF_3$ or $LaF_3$.

23. The method, as set forth in claim 19, wherein the second layer comprises $SiO_2$.

24. The method, as set forth in claim 19, wherein the first and third phase-shifting layers comprise the same chemical composition different from the compositions of the substrate and of the second phase-shifting layer.

25. A method of fabricating a photomask comprising the acts of:
   providing a substantially transparent substrate;
   disposing a first phase-shifting layer over the substrate, the first phase-shifting layer having a first thickness;
   disposing a second phase-shifting layer over the first phase-shifting layer, the second phase-shifting layer having a second thickness, the first phase-shifting layer acting as an etch stop for the second phase-shifting layer;
   disposing a third phase-shifting layer over the second phase-shifting layer, the third phase-shifting layer having a third thickness, the second phase-shifting layer acting as an etch stop for the third phase-shifting layer, wherein a sum of the first, second, and third thicknesses substantially corresponds to a phase shift of about 180°; and
   disposing an opaque layer over the third phase-shifting layer, the opaque layer having a plurality of openings formed therein, wherein a portion of at least one of the first, second, and third layers is removed underlying selected ones of the plurality of the openings.

26. The method, as set forth in claim 25, wherein each of the first, second, and third thicknesses corresponds to a phase shift of less than 180°.

27. The method, as set forth in claim 25, wherein each of the first, second, and third thicknesses corresponds to a phase shift of about 60°.

28. The method, as set forth in claim 25, wherein the first phase-shifting layer comprises $YF_3$ or $LaF_3$.

29. The method, as set forth in claim 25, wherein the second phase-shifting layer comprises $SiO_2$.

30. The method, as set forth in claim 25, wherein the first and third phase-shifting layers comprise the same chemical composition different from the compositions of the substrate and of the second phase-shifting layer.

31. An method for fabricating a semiconductor photomask, comprising the acts of:
   providing a substrate;
   disposing at least three layers on the substrate, at least two of the layers having chemical compositions different than the substrate;
   disposing a top layer over the at least three layers; and
   forming openings within the top layer and at least two of the at least three layers such that light incident upon the photomask exits the photomask with at least three phase angles.

32. The method, as set forth in claim 31, wherein each of the at least three layers has a thickness corresponding to a preselected phase-shift angle.

33. The method, as set forth in claim 32, wherein the preselected phase-shift angle of each of the at least three layers is 60°.

34. The method, as set forth in claim 31, wherein each of the at least three layers is of substantially uniform thickness.

35. The method, as set forth in claim 31, wherein the substrate is substantially transparent.

36. The method, as set forth in claim 31, wherein the substrate is quartz.

37. The method, as set forth in claim 31, wherein the at least three layers comprise a first layer, a second layer, and a third layer.

38. The method, as set forth in claim 37, wherein the first layer comprises $YF_3$ or $LaF_3$.

39. The method, as set forth in claim 37, wherein the second layer comprises $SiO_2$.

40. The method, as set forth in claim 37, wherein the first layer and the third layer comprise an identical chemical composition.

41. The method, as set forth in claim 31, wherein the top layer comprises metallic material.

42. The method, as set forth in claim 41, wherein the metallic material is chrome.

43. The method, as set forth in claim 31, wherein a lower layer of the at least three layers comprises a chemical composition such that the lower layer acts as an etch stop layer of a higher layer of the at least three layers.

44. The method, as set forth in claim 32, wherein at least two of the at least three layers comprise different chemical compositions.

45. The method, as set forth in claim 31, wherein the at least three layers comprise at least one of $YF_3$, $LaF_3$, and $SiO_2$.

* * * * *